(12) United States Patent  (10) Patent No.: US 7,825,436 B2
Iwasaki  (45) Date of Patent: Nov. 2, 2010

(54) THIN FILM ELECTRON SOURCE

(75) Inventor: Tomio Iwasaki, Tsukuba (JP)

(73) Assignee: Hitachi, Ltd., Tokyo (JP)

( * ) Notice: Subject to any disclaimer, the term of this patent is extended or adjusted under 35 U.S.C. 154(b) by 467 days.

(21) Appl. No.: 11/695,781

(22) Filed: Apr. 3, 2007

(65) Prior Publication Data
US 2007/0241320 A1   Oct. 18, 2007

(30) Foreign Application Priority Data
Apr. 14, 2006   (JP) ............... 2006-111501

(51) Int. Cl.
*H01L 29/737* (2006.01)
(52) U.S. Cl. .............. 257/198; 257/310; 257/588; 257/99; 257/E33.001; 313/310
(58) Field of Classification Search .......... 313/311, 313/495; 257/10, 59, 301, 296, 310, E33.001; 315/169.3
See application file for complete search history.

(56) References Cited

U.S. PATENT DOCUMENTS

| 5,656,823 A * | 8/1997 | Kruangam | 257/59 |
| 5,936,257 A * | 8/1999 | Kusunoki et al. | 257/10 |
| 6,320,324 B1 * | 11/2001 | Kusunoki et al. | 315/169.3 |
| 6,617,774 B1 * | 9/2003 | Kusunoki et al. | 313/311 |
| 6,818,941 B1 * | 11/2004 | Suzuki et al. | 257/310 |
| 2001/0000923 A1 * | 5/2001 | Takemura | 257/532 |
| 2003/0062558 A1 * | 4/2003 | Yang et al. | 257/296 |
| 2004/0124761 A1 * | 7/2004 | Kusunoki et al. | 313/495 |
| 2004/0155276 A1 * | 8/2004 | Iwasaki et al. | 257/301 |

FOREIGN PATENT DOCUMENTS

JP   2005-235781   9/2005

* cited by examiner

*Primary Examiner*—Chris Chu
*Assistant Examiner*—Fang-Xing Jiang
(74) *Attorney, Agent, or Firm*—Antonelli, Terry, Stout & Kraus, LLP.

(57) ABSTRACT

A thin film electron source comprising a substrate, a lower electrode formed on one main face of said substrate, an insulation layer formed in contact with said lower electrode and an upper electrode formed in contact with said insulation layer. The upper electrode comprises a first under-layer, a second under-layer, an intermediate layer and a surface layer laminated from the insulation layer side. A main material of the first under-layer is $IrO_2$ or $RuO_2$; a main material of the second under-layer is Ir or Ru, and a main material of the surface layer is a member selected from the group consisting of Au and Ag.

6 Claims, 4 Drawing Sheets

THIN FILM ELECTRON SOURCE

CLAIM OF PRIORITY

The present application claims priority from Japanese application serial No. 2006-111501, filed on Apr. 14, 2006, the content of which is hereby incorporated by reference into this application.

FIELD OF THE INVENTION

The present invention relates to a thin film electron source or emitter for emitting electrons in vacuum, which has a laminated structure of metal/insulator/metal or metal/insulator/semiconductor and to appliances using the thin film electron source. This electron source may be called a thin film emitter.

RELATED ART

A thin film electron source, which is disclosed in Japanese patent pre-publication 2005-235781, for example, has a laminated structure of upper electrode/insulation layer/lower electrode, and a voltage is applied between the electrodes thereby to emit electrons from the surface of the surface of the upper electrode into vacuum. There are an MIM (metal/insulator/metal) type electron source and MIS (metal/insulator/semiconductor), which uses a semiconductor as one of the electrodes.

FIG. 2 shows an operation principle shown in Japanese patent pre-publication 2005-235781. When a voltage Vd is applied between the upper electrode 113 and the lower electrode 111, electrons present near the Fermi band are injected by the action of tunnel effect into the conductive bands of the insulation layer 112 and the upper electrode 113 through a barrier to become hot electrons. The hot electrons disperse in the insulation layer 112 and the upper electrode 113 to loses energy; hot electrons among them having energy of work function φ of the upper electrode 113 are released into vacuum 120. The thin film electron sources are expected as new type electron sources.

Japanese patent pre-publication 2005-235781

SUMMARY OF THE INVENTION

In steps of manufacturing the electron sources, they are subjected to high temperatures as is disclosed in the Japanese pre-publication, when the electron sources are sealed to a caver member.

The inventors discovered that materials of the electrodes etc. actively diffuse at high temperatures so that disconnection of a low resistance layer (a thin film of Au or a main material is Au) may occur at grain boundaries. One of the objects of the present invention is to provide a thin film electron source with a high reliability.

It is another object of the present invention to provide a thin film electron source with a high heat resistance.

It is still another object to provide an appliance to which a thin film electron source with a high reliability is applied.

The inventors found that disconnection of the low resistance layer of the upper electrode in the thin film electron source comprising a substrate, a lower electrode formed on a one main surface of the substrate, an insulation layer formed in contact with the lower electrode, and an upper electrode formed in contact with the insulation layer could be prevented by optimizing a material for the upper electrode.

The objects of the present invention will be solved by the thin film electron source having the following combinations.

(1) A thin film electron source comprising:
  a substrate;
  a lower electrode or bottom electrode formed on one main face of said substrate;
  an insulation layer formed in contact with said lower electrode; and
  an upper electrode or top electrode formed in contact with said insulation layer;

wherein said upper electrode comprises a first under-layer, a second under-layer, an intermediate layer and a surface layer laminated from said insulation layer side, a main material of said first under-layer being $IrO_2$ or $RuO_2$; a main material of said second under-layer being Ir or Ru, and a main material of said surface layer being a member selected from the group consisting of Au and Ag. A preferable main material of the insulation layer is $Al_2O_3$ or $TiO_2$.

(2) A thin film electron source comprising:
  a substrate;
  a lower electrode or bottom electrode formed on one main face of said substrate;
  an insulation layer formed in contact with said lower electrode; and
  an upper electrode or top electrode formed in contact with said insulation layer;

wherein said upper electrode comprises a first under-layer, a second under-layer. A first intermediate layer, a second intermediate layer and a surface layer laminated from said insulation layer side, a main material of said lower electrode being Al, a main material of said insulation layer being $Al_2O_3$, a main material of said first under-layer being $IrO_2$ or $RuO_2$, a main material of said second lower layer being Ir or Ru, a main material of said first intermediate layer being a member selected from the group consisting of PtIr, PtRu and PtRh, a main material of said second intermediate layer being Pt and a main material of said surface layer being is a member selected from the group consisting of Au and Ag. In the specification, PtIr, PtRu and PtRh represent that alloys consisting of Pt and each of Ir, Ru and Rh contains 50 atomic % of each element.

A preferable main material of the insulation layer in (2) is $Al_2O_3$ or $TiO_2$.

The present invention provides a thin film electron source with high reliability. Further, it provides a thin film electron source with high heat resistance. It also provides an appliance having a thin film electron source with high reliability. Further, it provides an appliance having a thin film electron source with high heat resistance.

DETAILED DESCRIPTION OF PREFERRED EMBODIMENTS

Embodiments

In the following, embodiments of the present invention will be explained in detail by reference to drawings.

Figure 1:
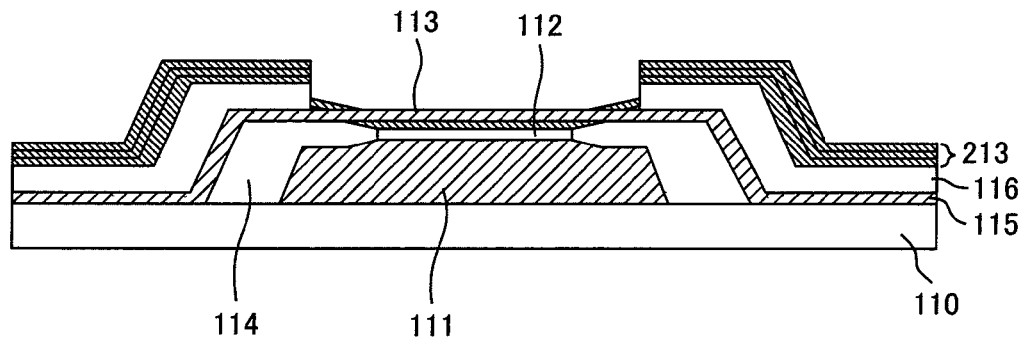
FIG. 1 is a cross sectional view of a thin film electron source according to the first embodiment of the present invention.
Figure 2:
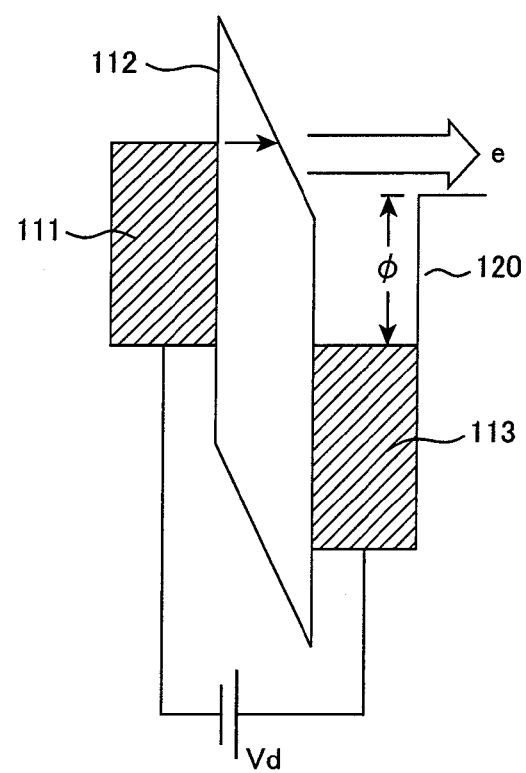
FIG. 2 shows an operation principle of the thin film electron source.

At first, FIG. 1 shows a cross sectional view of a thin film electron source according to a first embodiment. Here, a thin film electron source of a substrate/an insulator/a metal type is explained as an example of the thin film electron source.

In the beginning, a lower electrode 111 is formed on a substrate 110. A material of the lower electrode is Al, Al alloys, Ti, Ti alloys, etc.

Next, a portion for electron emission in the lower electrode 111 is masked with a photo-resist mask. The exposed portions are subjected to weakly anodic oxidation to form protective insulation layer 112 and 114 whose main material is Al2O3 or TiO2. The protective insulation film 114 suppresses or controls the electron emission portion and prevents concentration of electric field at the edge portions of the lower electrode 111.

After the protective insulation layer 114 is formed by the anodic-oxidation, the resist mask is removed to expose a part of the surface of the lower electrode. Then, an electron emission portion in the exposed surface of the lower electrode is subjected to the anodic oxidation. Thereafter, a film for bus electrode wiring is formed. As a basic structure, there is shown a two-layered bus electrode wiring structure wherein a under-layer 115, in contact with the upper electrode 113, for bus electrode wiring and a under-layer 116 for electric power supply bus electrode wiring.

Next, a film for the upper electrode 113 is formed by a sputtering method. The film is a laminated structure comprising a first under-layer, second under-layer, an intermediate layer and a surface layer from the insulation layer side. The layers are made of $IrO_2$, Ir, Pt alloy and Au, respectively. Thicknesses of the layers are about 0.4 nm, 0.4 nm, 1.2 nm and 1.2 nm, respectively: the total thickness is 3 to 4 nm. Other thicknesses in nanometer scales are acceptable. A size of the electron emission portion is 50 micrometers.

In FIG. 1, the film of four metal layers constituting the upper electrode is formed as a metal layer 213 on an upper layer 116 of the bus electrode wiring thereby to lower resistance of the bus electrode wiring.

Then, advantages of the embodiments according to the present invention will be explained. One of the advantages of the embodiments is to keep a depth of grooves formed between grain boundaries (herein after called grain boundary grooves) of the surface layer (Au) at the time of heat treatment thereby to prevent disconnection or breakage of the wire. This advantage is achieved when an alloy such as PtIr, PtRu or PtRh is used as the intermediate layer.

Figure 3:
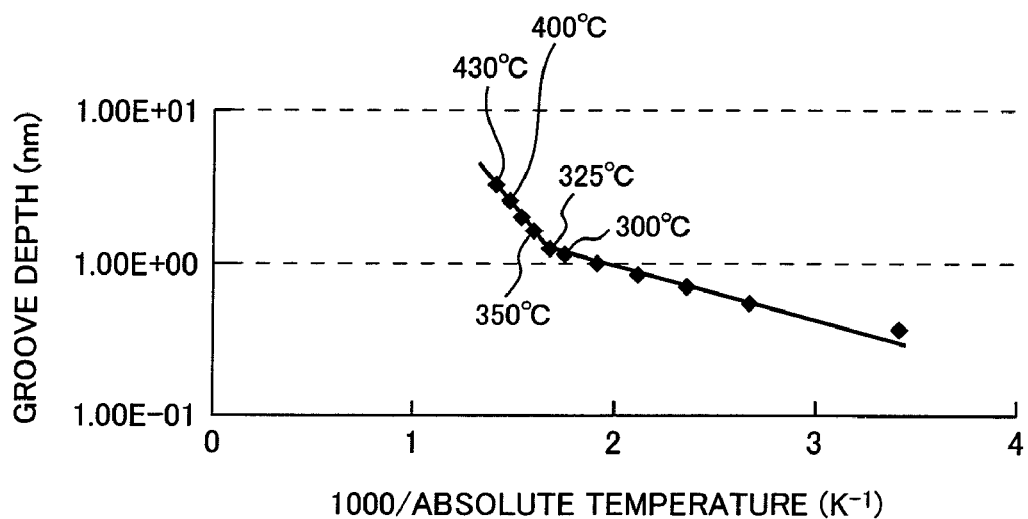
FIG. 3 shows relationship between a depth of a groove in the grain boundaries formed in a surface layer and temperature for heat treatment when pure Pt as an intermediate layer in a conventional example is used.

Relationship between depth of the grain boundary groove and heat treatment temperature is shown in FIGS. 3 to 6. FIG. 3 shows a result of analysis of the depth of grain boundary groove in case of Ir 2 atoms-Pt 6 atoms-Au 6 atoms with (111) orientation.

Figure 4:
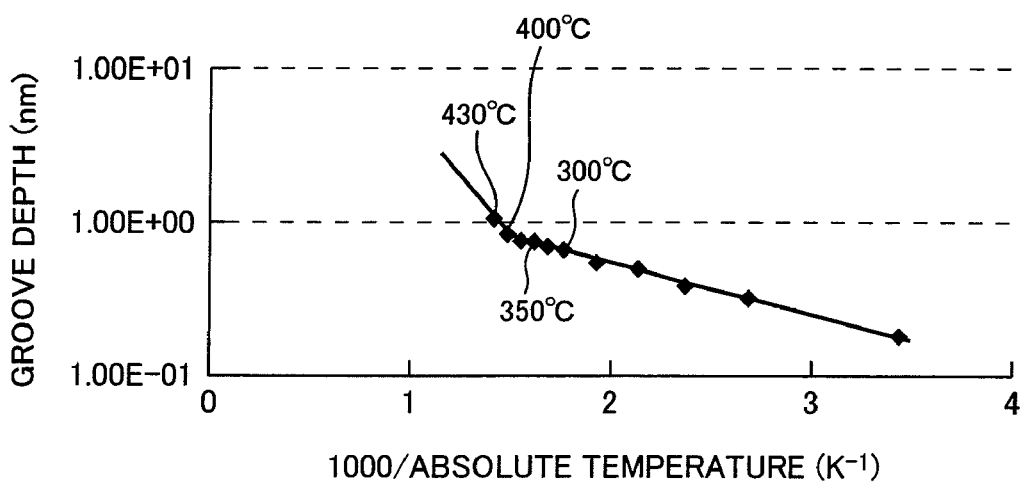
FIG. 4 shows relationship between a depth of a groove in the grain boundaries formed in a surface layer and temperature for heat treatment when using pure PtIr as an intermediate layer in the second embodiment.

FIG. 4 shows a result of analysis of the depth of grain boundary groove in case of Ir 2 atoms-PtIr 6 atoms-Au 6 atoms with (111) orientation.

Figure 5:
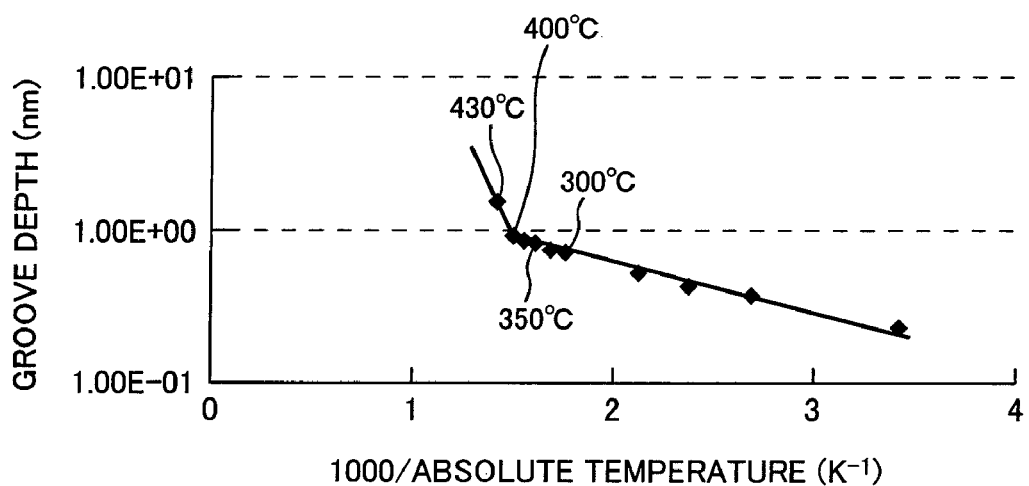
FIG. 5 shows relationship between a depth of a groove in the grain boundaries formed in a surface layer and temperature for heat treatment when using pure PtRu as an intermediate layer in the third embodiment.

FIG. 5 shows a result of analysis of the depth of grain boundary groove in (111) orientation of Ir 2 atoms-PtRu 6 atoms-Au 6 atoms with (111) orientation.

Figure 6:
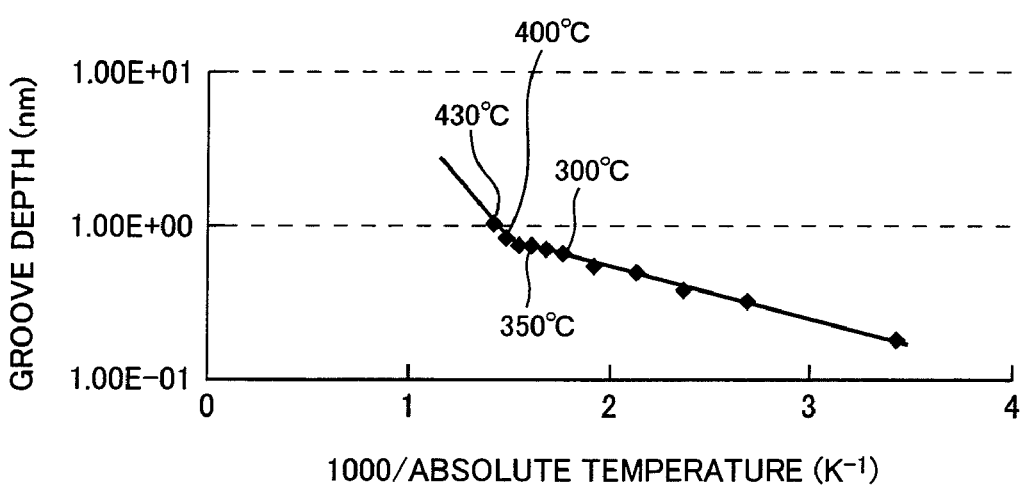
FIG. 6 shows relationship between a depth of a groove in the grain boundaries formed in a surface layer and temperature for heat treatment when using pure PtRh as an intermediate layer in the fourth embodiment.

FIG. 6 shows a result of analysis of the depth of grain boundary groove in case of Ir 2 atoms-PtRh 6 atoms-Au 6 atoms with (111) orientation.

It is apparent from FIGS. 3 to 6 that as the temperature elevates and the grain boundary grooves of the surface layer (Au) become deeper, the surface of the intermediate layer beneath the surface layer is exposed to cause the surface layer to be disconnected. FIG. 3 shows the result of the case where pure Pt is used instead of Pt alloy.

FIG. 4 shows the result where PtIr is used as the intermediate layer; FIG. 5 shows the result where PtRu is used; and FIG. 6 shows the result where PtRh is used.

In these graphs, changes of active energy cause the lines to be bent; that is, the changes are interpreted as a structure change of the films. The intermediate films begin to be exposed to disconnect the surface layer (Au) around the temperatures where the lines are bent. From these figures, it is apparent that when pure Pt is used as the intermediate layer, the surface layer is disconnected at around 325° C.; however, when PtIr, PtRu and/or PtRh is used as the intermediate layer, the surface layer does not disconnect until around 400° C.

Though it may depend on the thickness of the surface layer, when heat treatment at a temperature of 325° C. or higher is carried out after the formation of the surface layer (Au), the possibility of disconnection of the surface layer can be made small by using PtIr, PtRu and/or PtRh as the intermediate layer. The thickness of the surface layer is 1.2 nm; since the film is re-orientated by heat treatment, the intermediate layer begins to be exposed when a grain boundary groove of a depth of about 1 nm is formed.

Another advantage of the embodiments is suppression of diffusion of Au in the surface layer so that distribution of electron emission is stabilized when such the alloys as PtIr, PtRu and/or PtRh is used for the intermediate layer.

Figure 7:
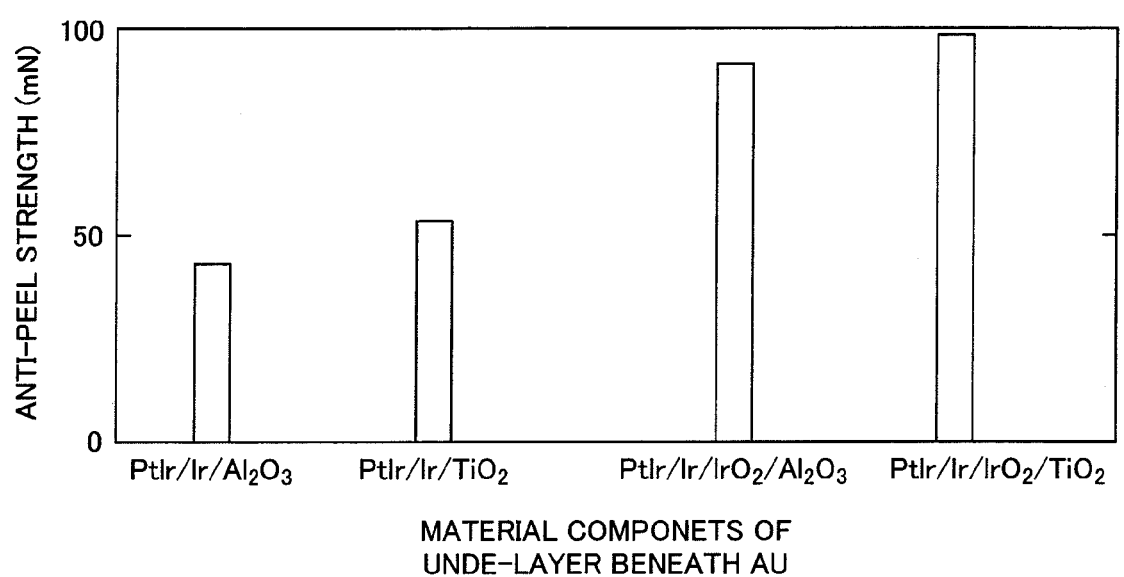
FIG. 7 shows anti-peel strength a thin film electron source when using IrO2 as a first under-layer in the first embodiment.

A combination of the second under-layer/the first under-layer that is an under layer of the intermediate layer is $Ir/IrO_2$ or $Ru/RuO_2$, which has a good close adhesion to the insulation layer. If the first under-layer of $IrO_2$ or $RuO_2$ is not present, i.e. only the second under-layer is present, the anti-peel strength becomes one half or less, compared to both the first and second under-layers are present. This advantage is shown in FIG. 7 where $IrO_2$ is used. $RuO_2$ exhibits the same advantage.

As to the intermediate layer, a two layer type intermediate layer comprising the intermediate layer of PtIr, PtRu and/or PtRh and a second intermediate layer of Pt as a main material in contact with the first intermediate layer is preferable because the two intermediate type has a lower electric resistance than the case where only the first intermediate layer is used.

What is claimed is:

1. A thin film electron source comprising:
   a substrate;
   a lower electrode formed on a main surface of said substrate;
   an insulation layer formed in contact with said lower electrode; and an upper electrode formed in contact with said insulation layer, which upper electrode comprises a surface for emitting electrodes in a vacuum, wherein, in order to prevent disconnection of the upper electrode from said insulation layer that it is in contact with, said upper electrode comprises a first under-layer formed on the insulation layer, a second under-layer formed on the first under-layer, an intermediate layer formed on the second under-layer and a surface layer formed on the intermediate layer, a main material of said lower electrode being Ti, a main material of said insulation layer being $TiO_2$, a main material of said first under-layer being $IrO_2$ or $RuO_2$, a main material of said second under-layer being Ir or Ru, a main material of said intermediate layer being a member selected from the group consisting of PtIr, PtRu and PtRh, and a main material of said surface layer being a member selected from a group consisting of Au and Ag.

2. An appliance having a base carrying a plurality of the thin film electron sources thereon according to claim 1.

3. A thin film electron source comprising:

a substrate;

a lower electrode formed on a main surface of said substrate;

an insulation layer formed in contact with said lower electrode; and an upper electrode formed in contact with said insulation layer which constitutes a surface for emitting electrodes in a vacuum, wherein, in order to prevent disconnection of the upper electrode from said insulation layer that it is in contact with, said upper electrode comprises a first under-layer formed on the insulator layer, a second under-layer formed on the first under-layer, a first intermediate layer formed on the second under-layer, a second intermediate layer formed on the first intermediate layer and a surface layer formed on the second intermediate layer, a main material of said lower electrode being Ti, a main material of said insulation layer being TiO2, a main material of said first under-layer being $IrO_2$ or $RuO_2$, a main material of said second under-layer being Ru, a main material of said first intermediate layer being a member selected from the group consisting of PtIr, PtRu and PtRh, a main material of said second intermediate layer being Pt, and a main material of said surface layer being a member selected from the group consisting of Au and Ag.

4. An appliance having a base carrying a plurality of the thin film electron sources thereon according to claim 2.

5. A thin film electron source comprising:

a substrate;

a lower electrode formed on said substrate;

an insulation layer formed in contact with said lower electrode; and an upper electrode formed in contact with said insulation layer which constitutes a surface for emitting electrodes in a vacuum, wherein, in order to prevent disconnection of the upper electrode from said insulation layer that it is in contact with said upper electrode comprises an under layer formed on the insulation layer, a first intermediate layer formed on the under-layer, a second intermediate layer formed on the first intermediate layer and a surface layer formed on the second intermediate layer, a main material of said lower electrode being Ti, a main material of said insulation layer being $TiO_2$, a main material of said under-layer being Ir or Ru, a main material of said first intermediate layer being a member selected from the group consisting of PtIr, PtRu and PtRh, a main material of said second intermediate layer being Pt, and a main material of said surface layer being a member selected from the group consisting of Au and Ag.

6. An appliance having a base carrying a plurality of the thin film electron sources thereon according to claim 5.

* * * * *